United States Patent [19]

Kuroda

[11] Patent Number: 4,635,343
[45] Date of Patent: Jan. 13, 1987

[54] METHOD OF MANUFACTURING GAAS SEMICONDUCTOR DEVICE

[75] Inventor: Shigeru Kuroda, Hadano, Japan

[73] Assignee: Fujitsu Limited, Kawasaki, Japan

[21] Appl. No.: 587,967

[22] Filed: Mar. 9, 1984

[30] Foreign Application Priority Data

Mar. 14, 1983 [JP] Japan .............................. 58-042007

[51] Int. Cl.[4] .................... H01L 21/203; H01L 21/205
[52] U.S. Cl. .................................... 29/571; 29/576 B; 29/576 W; 29/577 C; 29/578; 29/580; 148/1.5; 148/175; 148/177; 156/646
[58] Field of Search ...................... 29/571, 577 C, 578, 29/576 W, 576 B, 580; 148/1.5, 177, 175; 156/646

[56] References Cited

U.S. PATENT DOCUMENTS

| 4,371,968 | 2/1983 | Trussell et al. | 29/569 L |
| 4,523,961 | 6/1985 | Hartman et al. | 148/171 X |
| 4,545,109 | 10/1985 | Reichert | 25/580 X |

FOREIGN PATENT DOCUMENTS

A0064370 11/1982 European Pat. Off. .

OTHER PUBLICATIONS

Hiyamizu et al. *Appl. Phys. Lett.*, 37(9), Nov. 1, 1980, pp. 805–807.
Abe et al., Solid State Device 1982, ESSDERC-SSSDT Meeting at Munich, 13th–16th, Sep. 1982, "Advanced Device Technology for High Speed GaAs VLSI", pp. 25–50.
Lee et al, *Electronics Letters*, vol. 19, No. 5, Mar. 3, 1983, "High Performance Modulation-Doped GaAs Integrated Circuits with Planar Structures", pp. 155–157.
Hirosaka et al. *Japanese Journal of Applied Physics*, vol. 20, No. 11, Nov. 1981, Selective Etching of AlGaAs-GaAs Heterojunction", pp. L847–L850.

*Primary Examiner*—George T. Ozaki
*Attorney, Agent, or Firm*—Staas & Halsey

[57] ABSTRACT

A method of manufacturing a GaAs semiconductor device of an E/D construction having a GaAs/AlGaAs heterojunction and utilizing two-dimensional electron gas, which includes the steps of forming a heterojunction semiconductor substrate and etching a portion of the substrate to provide a gate portion of a depletion-mode FET. When the substrate of a semi-insulating GaAs layer, an undoped GaAs, an N-type AlGaAs layer providing an electron-supply layer, and a GaAs layer is formed, the GaAs layer is composed of a first GaAs layer, an etching stoppable AlGaAs layer, and a second GaAs layer, the first GaAs layer being formed on the N-type GaAs layer. The etching for provision of the gate portion is carried out by a dry etching method using an etchant of $CCl_2F_2$ gas, so that the second GaAs layer can be etched but the AlGaAs layer cannot be etched. Thus, the thickness of the layers between a gate electrode of the depletion-mode FET and the GaAs/AlGaAs heterojunction plane is determined by the formation of the heterojunction substrate, and consequently a better uniformity of the threshold voltage of depletion-mode FETs is obtained.

46 Claims, 17 Drawing Figures

METHOD OF MANUFACTURING GAAS SEMICONDUCTOR DEVICE

BACKGROUND OF THE INVENTION

The present invention relates to a gallium arsenide (GaAs) semiconductor device comprising an enhancement-mode GaAs field effect transistor (FET) and a depletion-mode GaAs FET (referred to as an enhancement/depletion (E/D) construction), more particularly to an improved method of manufacturing a GaAs semiconductor device of the E/D construction having a heterojunction and utilizing a two-dimensional electron gas.

Direct-coupled FET logic (DCFL) circuits having an E/D construction operate at a low power consumption and are suitable for high integration. Techniques for realizing such circuits by a compound semiconductor are being continually advanced. A simple example of a DCFL circuit is an inverter circuit having an E/D construction.

GaAs semiconductor devices having an E/D construction have been produced by using a GaAs-/aluminum gallium arsenide (AlGaAs) heterojunction semiconductor substrate (for example, European patent application No. 82302107.6, i.e., EP-A-0064370). In such GaAs semiconductor devices, the enhancement-mode FET and the depletion-mode FET can operate by utilizing a two-dimensional electron gas generated in the upper portion of an undoped GaAs layer adjoining an N-type AlGaAs layer, i.e., at the interface of the GaAs/AlGaAs heterojunction.

In order to form an enhancement-mode FET and a depletion-mode FET by using the GaAs/AlGaAs semiconductor substrate, it is necessary to obtain an active layer under a gate electrode of each of the FETs having a predetermined thickness. In this case, the active layer means a layer or layers lying between the gate electrode and the GaAs/AlGaAs heterojunction plane. A conventional heterojunction semiconductor substrate comprises a semi-insulating GaAs substrate, an undoped GaAs layer (high purity layer), an N-type AlGaAs layer (electron-supply layer), and an N+-type GaAs layer (contact layer), which layers are formed in sequence on the GaAs substrate by a molecular beam epitaxy (MBE) method or a metal organic chemical vapor deposition (MOCVD) method. It is preferable to form an undoped AlGaAs layer between the undoped GaAs layer and the N-type AlGaAs layer, since the undoped AlGaAs layer serves as a buffer and contributes to increasing the electron mobility. For example, the heterojunction semiconductor substrate comprises the above layers having the following thicknesses and impurity concentrations.

| Layer | Thickness (nm) | Impurity concentration (cm$^{-3}$) |
| --- | --- | --- |
| Undoped GaAs | 300 | — |
| Undoped AlGaAs | 6 | — |
| N-type AlGaAs | 50 | $1 \times 10^{18}$ |
| N-type GaAs | 50 | $2 \times 10^{18}$ |

In order to form a gate portion of an enhancement-mode FET in the heterojunction semiconductor substrate, it is preferable to carry out selective etching of the N-type GaAs by just a dry etching method using a reactive gas of $CCl_2F_2$. In such selective etching, the etching automatically stops at the surface of the N-type AlGaAs layer. Therefore, an N-type AlGaAs layer having a predetermined thickness for formation of the enhancement-mode FET is formed, so that good uniformity of threshold voltage $V_{th}$ of enhancement-mode FETs simultaneously formed in a wafer can be attained.

On the other hand, in order to form a gate portion of a depletion-mode FET in the heterojunction semiconductor substrate, a portion of the N-type GaAs layer is etched by a wet chemical etching method so as to form the remaining thickness of the N-type GaAs layer and the thickness of the N-type AlGaAs layer thereunder into a predetermined thickness for formation of the depletion-mode FET. Although attempts have been made to accurately control the etch depth (i.e., the etched quantity) in wet etching, in practice, uniformity of etch depth of depletion-mode FETs simultaneously formed in a wafer is relatively low. Therefore, the uniformity of threshold voltage $V_{th}$ of the depletion mode FETs is also low.

SUMMARY OF THE INVENTION

An object of the present invention is to improve the uniformity of the threshold voltage $V_{th}$ of depletion-mode FETs of a GaAs semiconductor device having an E/D construction and produced by using a heterojunction semiconductor substrate.

Another object of the present invention is to provide a method of manufacturing a GaAs semiconductor device having an E/D construction in which etching treatments for adjusting the threshold voltages at both gate portions of an enhancement-mode FET and a depletion-mode FET are simultaneously performed under effective control.

Aother object of the present invention is to provide a GaAs semiconductor device comprising an enhancement-mode GaAs FET having a heterojunction and utilizing a two-dimensional electron gas and a depletion-mode GaAs metal semiconductor (MES) FET utilizing no two-dimensional electron gas.

Another object of the present invention is to provide a GaAs semiconductor device comprising an enhancement-mode GaAs FET and a depletion-mode GaAs FET which have a heterojunction and utilize a two-dimensional electron gas.

The above and other objects of the present invention are attained by forming an AlGaAs thin layer as an etching stoppable layer in a GaAs layer lying on an N-type AlGaAs layer as an electron-supply layer, namely, forming a triple-layer structure comprising a first GaAs layer, the etching stoppable AlGaAs layer, and a second GaAs layer formed in sequence on the electron-supply AlGaAs layer. The etching treatment for forming the gate portions of an enhancement-mode FET and a depletion-mode FET is carried out by a selective dry etching method using an etchant which can etch GaAs but cannot substantially etch AlGaAs. As a result of such selective etching, the thickness of active layers between gate electrodes and the GaAs/AlGaAs heterojunction plane for the enhancement-mode FET and the depletion-mode FET are determined at the formation of the active layer.

BRIEF EXPLANATION OF THE DRAWINGS

The present invention and its objects and features will become apparent during the course of the detailed description set forth below, rendered with reference to the accompanying drawings, in which.

DESCRIPTION OF THE PREFERRED EMBODIMENTS

Figure 1:
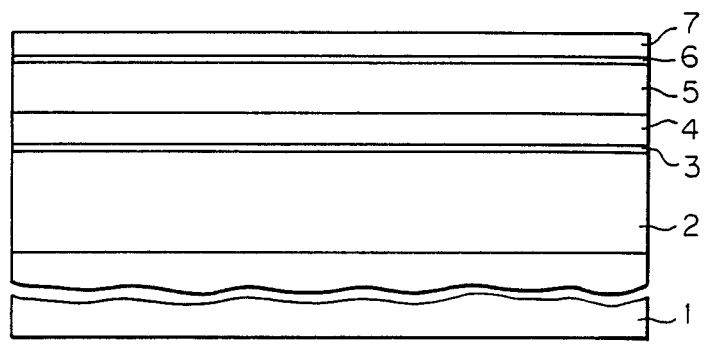
FIGS. 1 to 6 are schematic partially sectional views of a GaAs semiconductor device comprising an enhancement-mode FET utilizing two-dimensional electron gas and a depletion-mode MESFET in various stages of production in accordance with an embodiment of the present invention.

Referring to FIGS. 1 to 6, an explanation will be made of a process for manufacture of a GaAs semiconductor device comprising an enhancement-mode FET utilizing a two-dimensional electron gas and a depletion-mode MESFET not utilizing two-dimensional electron gas in accordance with a first embodiment of the present invention. As illustrated in FIG. 1, a heterojunction semiconductor substrate comprises a semi-insulating GaAs substrate (i.e., wafer) 1, an undoped GaAs layer 2, an undoped AlGaAs layer 3, an N-type AlGaAs layer 4, an N-type GaAs layer 5, an etching stoppable N-type AlGaAs layer 6, and a contact N-type GaAs layer 7, which layers are formed in sequence on the substrate 1 by an MBE method or an MOCVD method. It is possible to omit the undoped AlGaAs layer 3. The GaAs/AlGaAs heterojunction is formed with the undoped GaAs layer 2 and the undoped AlGaAs layer 3 (or the N-type AlGaAs layer 4). The N-type AlGaAs layer 4 serves as an electron-supply layer and has a thickness of from 25 to 60 nm, depending on the desired threshold voltage of the enhancement-mode FET and the impurity concentration thereof. The N-type GaAs layer 5 serves as an active layer of the depletion-mode GaAs MESFET. The thickness of the layer 5 depends on the desired threshold voltage of the depletion-mode GaAs MESFET and the impurity concentration thereof. The thickness of the etching stoppable $Al_yGa_{1-y}As$ layer 6 depends on the etching conditions and the mole ratio y of Al and is from 1 to 10 nm, preferably 3 to 6 nm.

For example, the heterojunction semiconductor substrate may comprise layers having the following thicknesses and impurity concentrations.

| | Layer | Thickness (nm) | Impurity concentration (cm$^{-3}$) |
|---|---|---|---|
| 2 | GaAs | 300 | — |
| 3 | AlGaAs | 6 | — |
| 4 | AlGaAs | 50 | $1 \times 10^{18}$ |
| 5 | GaAs | 100 | $1.8 \times 10^{17}$ |
| 6 | AlGaAs | 5 | $2 \times 10^{18}$ |
| 7 | GaAs | 50 | $2 \times 10^{18}$ |

Figure 2:
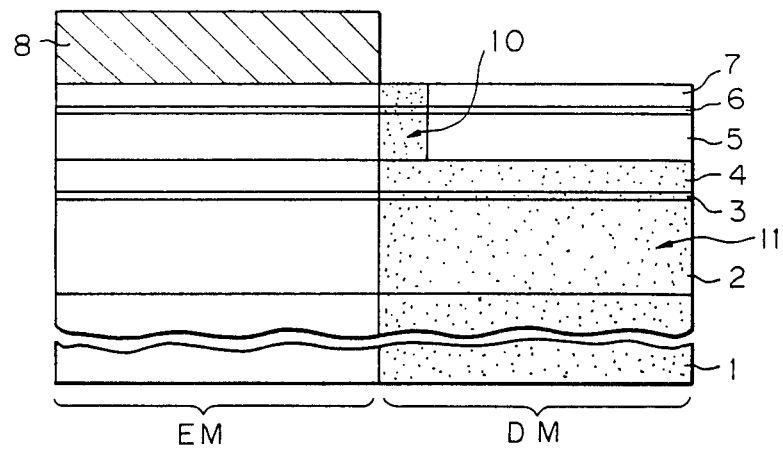

Next, a mask film 8 (FIG. 2) is formed on the heterojunction semiconductor substrate. For example, the mask film 8 may consist of a silicon dioxide ($SiO_2$) film having a thickness of approximately 200 nm and a titanium/gold (Ti/Au) film having a thickness of approximately 400 nm, be formed over the contact GaAs layer 7, and be selectively etched to form an opening (not shown) for a boundary region between a portion EM for the enhancement-mode heterojunction FET and a portion DM for the depletion-mode MESFET. Through the opening, oxygen ions or protons are shallowly doped into the heterojunction semiconductor substrate by an ion-implantation method so as to change portions of the layers 7, 6, and 5 into an insulation region 10 (FIG. 2). Then, the mask film 8 is further selectively etched so as to remove the portion lying on the portion DM. Thus, the remaining mask film 8 lies on the portion EM, as illustrated in FIG. 2. Oxygen ions or protons are deep-doped by an ion-implantation method to change the part under the N-type GaAs layer 5 into an insulator region 11 (FIG. 2). As a result of the ion-implantation treatments, the insulator regions 10 and 11 isolate a portion for the formation of the depletion-mode MESFET in the portion DM.

Figure 3:
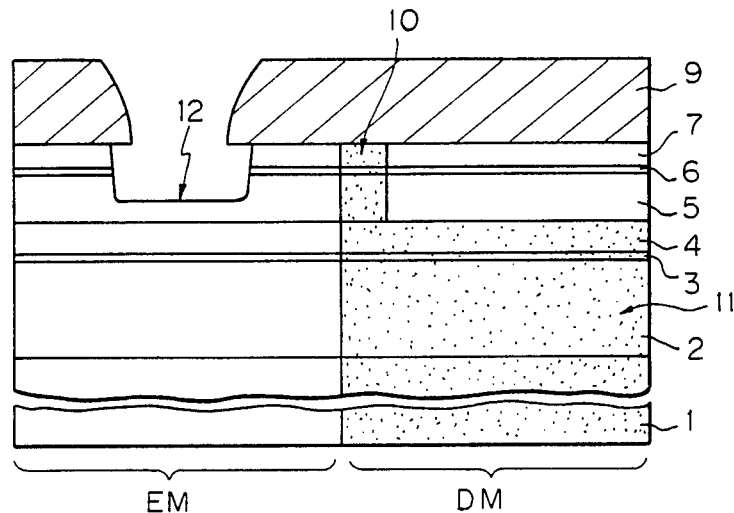

After the remaining mask film 8 is removed, another mask film 9 of, e.g., photoresist, is formed over the N-type GaAs layer 7 and is patterned to form an opening at a position for a gate of the enhancement-mode FET, as illustrated in FIG. 3. Through the opening, portions of the layers 7, 6, and 5 are selectively etched by a wet chemical etching method using, e.g., hydrofluoric acid (HF) to form a groove 12. In this etching treatment, it is necessary to remove the AlGaAs layer 6 and is preferable to make the remaining thickness of the GaAs layer 5 under the groove 12 similar to the thickness of the contact GaAs layer 7.

Figure 4:
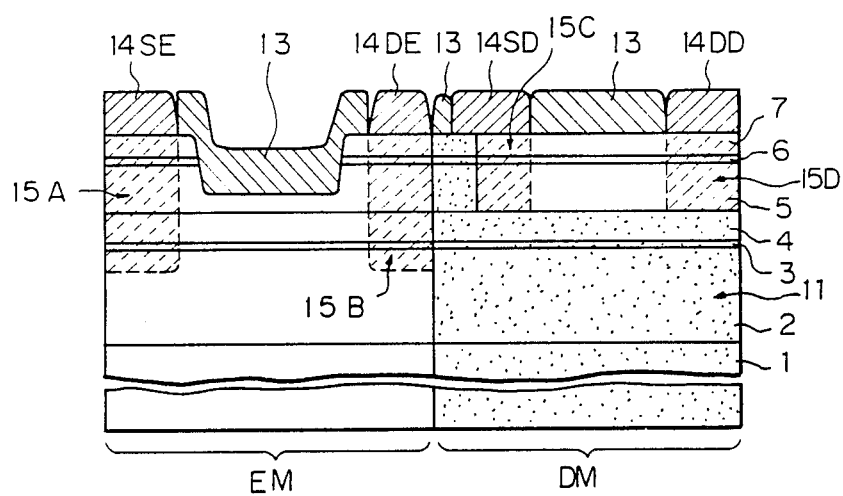

After the mask film 9 is removed, an $SiO_2$ film 13 (FIG. 4) is formed over the heterojunction semiconductor substrate by a reactive sputtering method or a chemical vapor deposition method. Another mask film (not shown) of photoresist is formed on the $SiO_2$ film 13 and is patterned. By using the patterned mask film, the $SiO_2$ film 13 is selectively etched by a suitable etching method to form source-electrode contact windows and drain-electrode contact windows, through which windows portions of the contact GaAs layer 7 are exposed. Retaining the patterned mask film, an electrode metal film is deposited on the exposed portions of the layer 7 and the mask film by a vacuum evaporation method, a sputtering method, or the like. The electrode metal film is preferably a multilayer of AuGe/Au, AuGe/Ni/Au, AuGe/Ni, or the like and has a thickness of, e.g., approximately 300 nm. When the photoresist mask film is removed by a solvent, a portion of the electrode metal film lying on the mask film is simultaneously removed to form source electrodes 14SE and 14SD and drain electrodes 14DE and 14DD, as illustrated in FIG. 4.

Namely, the electrode metal film is patterned by a so-called lift-off method. Then, heat treatment for alloying (e.g., at approximately 450° C. for 1 minute) is carried out to form alloyed regions 15A, 15B, 15C, and 15D (FIG. 4).

Figure 5:
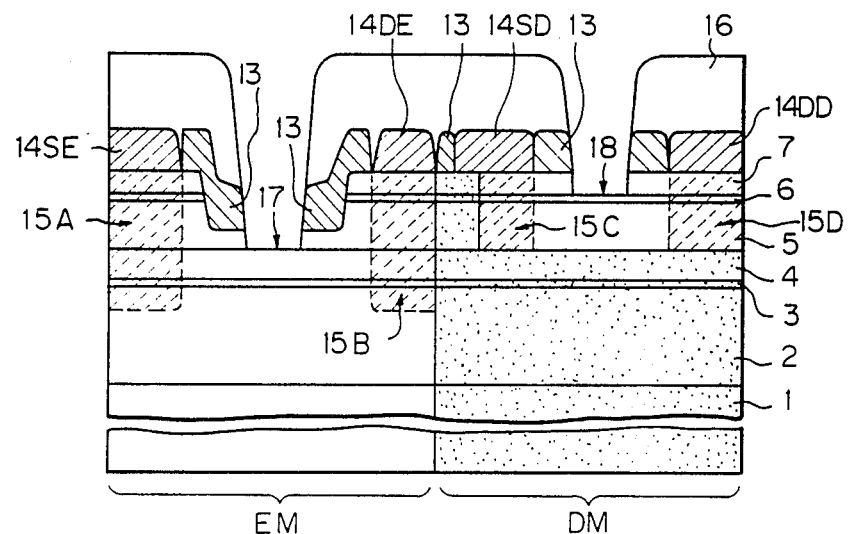
Figure 7:
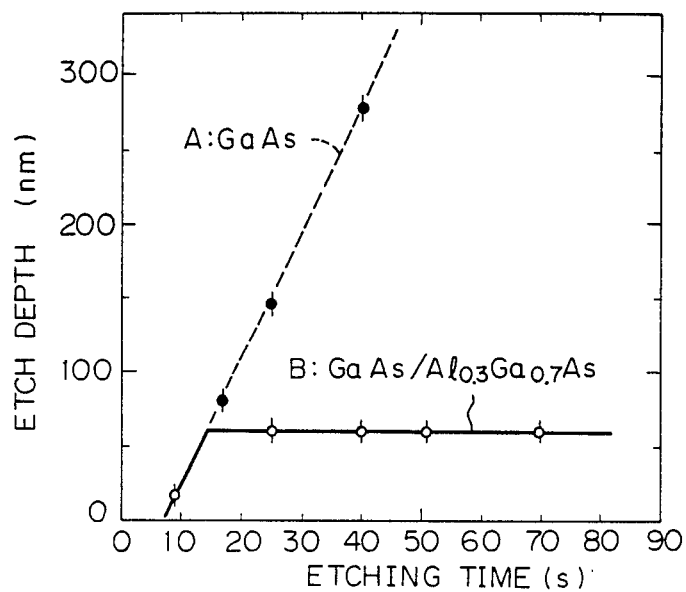
FIG. 7 is a graph showing the relationship between the etch depth and the etching time.

Next, another mask film 16 of photoresist is formed on the SiO$_2$ film 13 and the electrodes 14SE, 14DE, 14SD, and 14DD and is patterned to form openings at positions for gates of the enhancement-mode FET and the depletion-mode MESFET, as illustrated in FIG. 5. The SiO$_2$ film 13 is selectively etched by a suitable etching method such as a wet chemical etching method and a dry etching method, so that a portion of the GaAs layer 5 in the portion EM and a portion of the contact GaAs layer 7 in the portion DM are exposed in the openings. The exposed GaAs layers 5 and 7 are etched by a dry etching method using an etchant which can etch GaAs but cannot substantially etch AlGaAs, so that grooves 17 and 18 with AlGaAs bottoms are formed, as illustrated in FIG. 5. In this case, it is preferable to apply a reactive ion etching method using an etchant gas of CCl$_2$F$_2$ and a diluent or carrier gas of helium (He). For example, when dry etching of GaAs and Al$_{0.3}$Ga$_{0.7}$As is carried out under the following conditions, and results shown in FIG. 7 are obtained and the etch rates of GaAs and Al$_{0.3}$Ga$_{0.7}$As are 520 nm/min and 2 nm/min, respectively.

Power Density of Plasma Etching Apparatus: 0.18 W/cm$^2$
Pressure: 5 Pa
Used Gas: CCl$_2$F$_2$+He (at equal pressures)
Sample A: GaAs
Sample B: GaAs (60 mm thick)/Al$_{0.3}$Ga$_{0.7}$As It is possible to use an etchant gas comprising a chlorine system gas and a fluorine system gas at a suitable mixing ratio.

Figure 6:
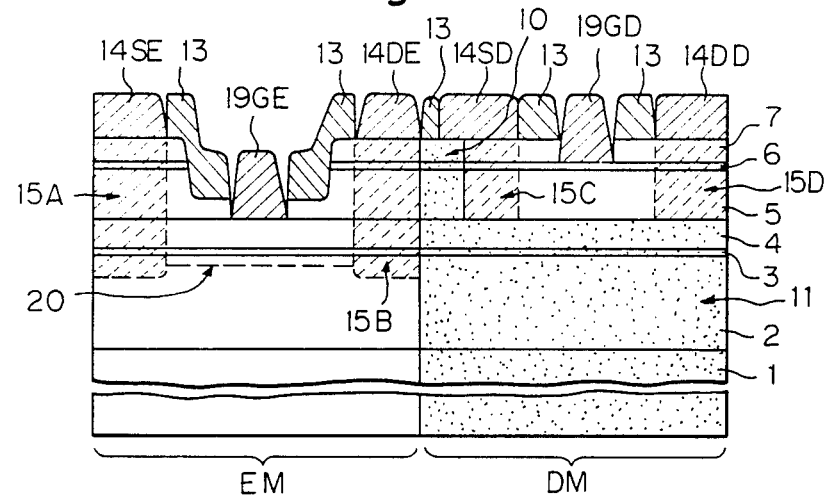

Retaining the mask film 16, another electrode metal film for gates is deposited on the exposed portions of the AlGaAs layers 4 and 6 and the mask film 16 by a vacuum evaporation method or a sputtering method. The electrode metal film is a multilayer of Ti/Pt/Au and has a thickness of, e.g., approximately 300 mm. The electrode metal film may be made of Al or a refractory metal silicide (e.g., WSi$_2$). When the mask film is removed by the solvent, the metal film is patterned by a lift-off method to form gate electrodes 19GE and 19GD, as illustrated in FIG. 6. Thus the enhancement-mode FET and the depletion-mode MESFET are formed in the portions EM and DM, respectively. When the enhancement-mode FET operates, a layer 20 of a two-dimensional electron gas is generated in the upper portion of the undoped GaAs layer 2 adjoining the GaAs/AlGaAs heterojunction plane. The exposed surfaces of the AlGaAs within the grooves 17 and 18 preferably are completely covered with the metal film for gates, i.e., the gate electrodes 19 GE and 19 GD. Namely, the metal film serves as a metal seal so as to prevent the AlGaAs from oxidizing. AlGaAs is a very oxidizable material, and an oxide of the AlGaAs is apt to effect the surface concentration of the two-dimensional electron gas.

Figure 8:
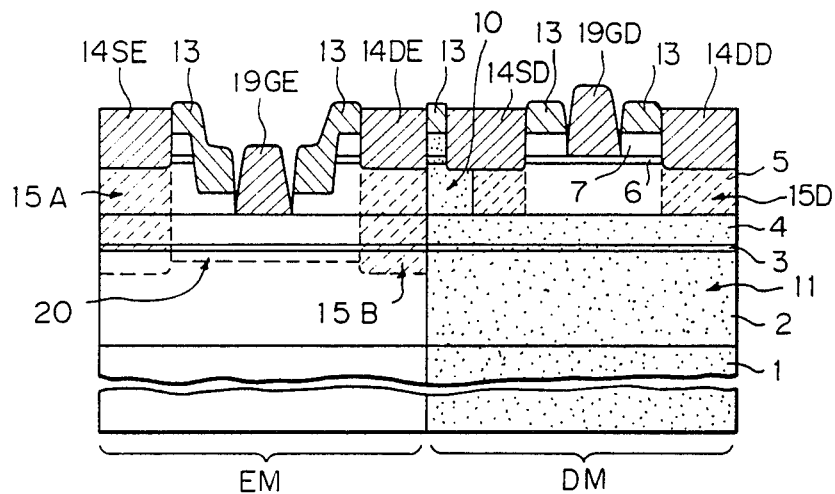
FIG. 8 is a schematic partially sectional view of a GaAs semiconductor device similar to that of FIG. 6.

FIG. 8 is a schematic partial sectional view of a GaAs semiconductor device comprising an enhancement-mode FET utilizing a two-dimensional electron gas and a depletion-mode MESFET similar to that of FIG. 6 but according to a second embodiment of the invention. Portions in FIG. 8 the same as those in FIGS. 1 to 6 are referenced by the same numerals. The GaAs semiconductor device is manufactured in accordance with the manufacturing process mentioned in the first embodiment, except for the addition of an etching step prior to the deposition of the electrode metal film for source and drain electrodes. Namely, after the formation of the source-electrode contact windows and the drain-electrode contact windows in the SiO$_2$ film 13, the exposed contact GaAs layer 7 and the etching stoppable AlGaAs layer 6 are selectively etched by applying, e.g., a wet chemical etching method to form recesses in which portions of the N-type GaAs layer 5 are exposed. Thus, the source electrodes 14SE and 14SD and the drain electrodes 14DE and 14DD can come into contact with the N-type GaAs layer 5 containing no aluminum, and consequently the contact property of the electrodes is very good.

Figure 9:
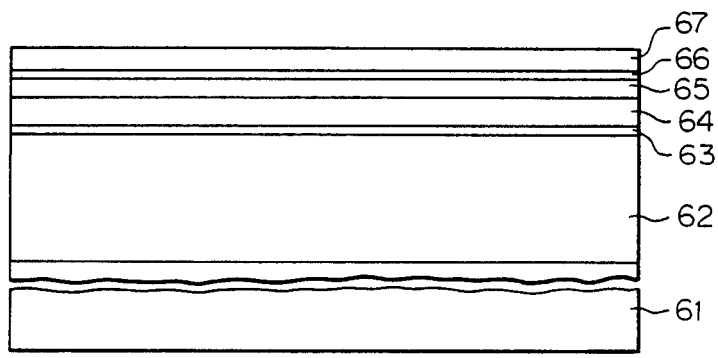
FIGS. 9 to 12 are schematic partially sectional views of a GaAs semiconductor device comprising an enhancement-mode FET and a depletion-mode FET, which utilize two-dimensional electron gas, in various stages of production in accordance with another embodiment of the present invention.

Referring to FIGS. 9 to 12, a process for manufacture of a GaAs semiconductor device comprising an enhancement-mode FET and depletion-mode FET, which utilize a two-dimensional electron gas, in accordance with a third embodiment of the present invention, will now be explained. As illustrated in FIG. 9, a heterojunction semiconductor substrate comprises a semi-insulating GaAs substrate 61, an undoped GaAs layer 62, an undoped AlGaAs layer 63, an N-type AlGaAs layer 64 of an electron-supply layer, a first GaAs layer 65, an etching stoppable AlGaAs layer 66, and a second GaAs layer 67, which layers are formed in sequence on the substrate 1 by an MBE method or an MOCVD method. It is possible to omit the undoped AlGaAs layer 63. The thickness of the electron-supply AlGaAs layer 64 is determined within the range of from 25 to 60 nm, depending on the desired threshold voltage of the enhancement-mode FET and the impurity concentration thereof. The thickness of the first GaAs layer 65 is determined within the range of from 20 to 200 nm, so as to attain the desired threshold voltage of the depletion-mode FET. The thickness of the layer 65 depends on the impurity concentration thereof. The thickness of the etching stoppable Al$_y$Ga$_{l-y}$As layer 66 depends on the etching conditions and the molar rate y of Al and is from 1 to 10 nm, preferably 3 to 6 nm. The layers 65, 66, and 67 preferably contain N-type impurities (e.g., silicon), so that they are N-type layers. It is possible to form the layers 65, 66, and 67 without doping of N-type impurities, thus they are i-layers.

For example, the heterojunction semiconductor substrate comprises the above layers having the following thicknesses and impurity concentrations.

| Layer | | Thickness (nm) | Impurity concentration (cm$^{-3}$) |
|---|---|---|---|
| 62 | GaAs | 300 | — |
| 63 | Omitted | | |
| 64 | AlGaAs | 30 | 2 × 10$^{18}$ |
| 65 | GaAs | 5 | 1 × 10$^{18}$ |
| 66 | AlGaAs | 5 | 2 × 10$^{18}$ |
| 67 | GaAs | 50 | 2 × 10$^{18}$ |

Figure 10:
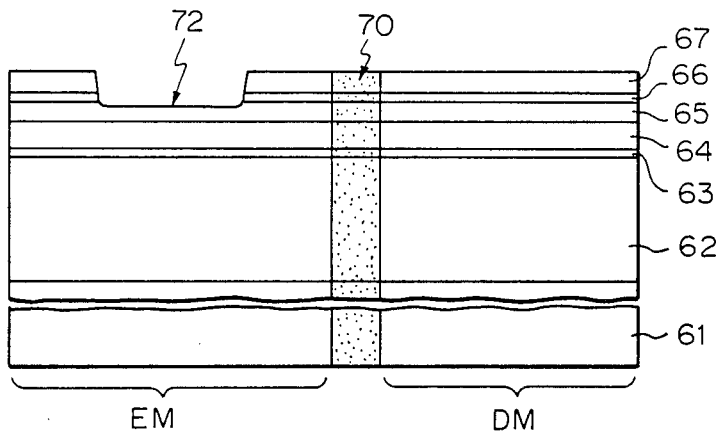

Next, a mask film (not shown) comprising an SiO$_2$ film and a Ti/Au film is formed on the second GaAs layer 67 and is selectively etched to form an opening at a boundary region between a portion for the enhancement-mode FET and another portion DM for the depletion-mode FET. Through the opening, oxygen ions or portons are doped into the heterojunction semiconductor substrate by an ion-implantation method, so as to form an isolation region 70, as illustrated in FIG. 10. After the mask film is removed, another mask film of photoresist is formed on the GaAs layer 67 and is patterned. Portions of the layers 67, 66, and 65 uncovered with the patterned mask film are selectively etched by a wet chemical etching method to form a groove 72 (FIG. 10). In this etching treatment, it is necessary to remove the AlGaAs layer 66, but the first GaAs layer 65 should not be completely removed.

Figure 11:
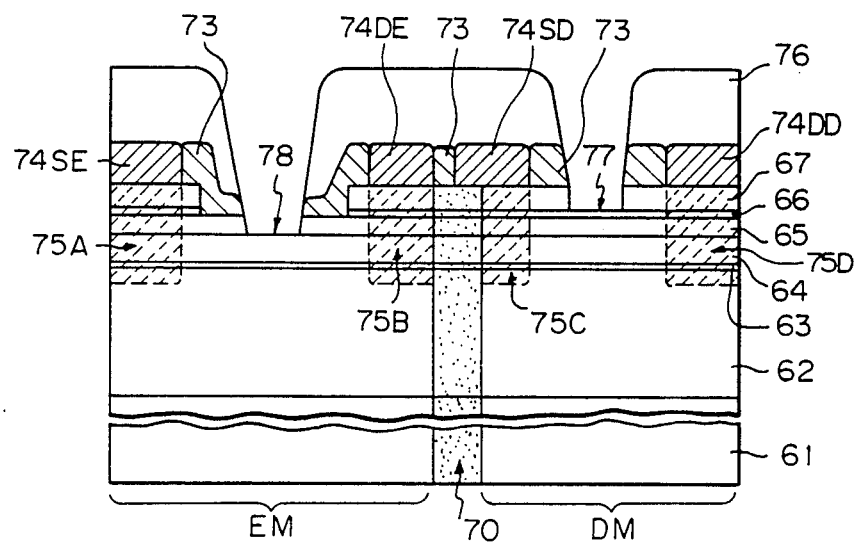

After the patterned mask film is removed, an SiO$_2$ film 73 (FIG. 11) is formed over the heterojunction semiconductor substrate and is patterned to form electrode contact windows. In the electrode contact windows, source electrodes 74SE and 74SD and drain electrodes 74DE and 74DD (FIG. 11) are formed in the manner mentioned in the first embodiment. Heat treatment for alloying is carried out to form alloyed regions 75A, 75B, 75C, and 75D. Then, another mask film 76 of photoresist is formed on the SiO$_2$ film 73 and is patterned, as illustrated in FIG. 11. The SiO$_2$ film 73 is selectively etched by a suitable etching method. Then, the second GaAs layer 67 and the first GaAs layer 65 are selectively etched by a dry etching method using an etchant (CCl$_2$F$_2$ gas) which can etch GaAs but cannot substantially etch AlGaAs, so as to form grooves 77 and 78 (FIG. 11), as mentioned in the first embodiment.

Figure 12:
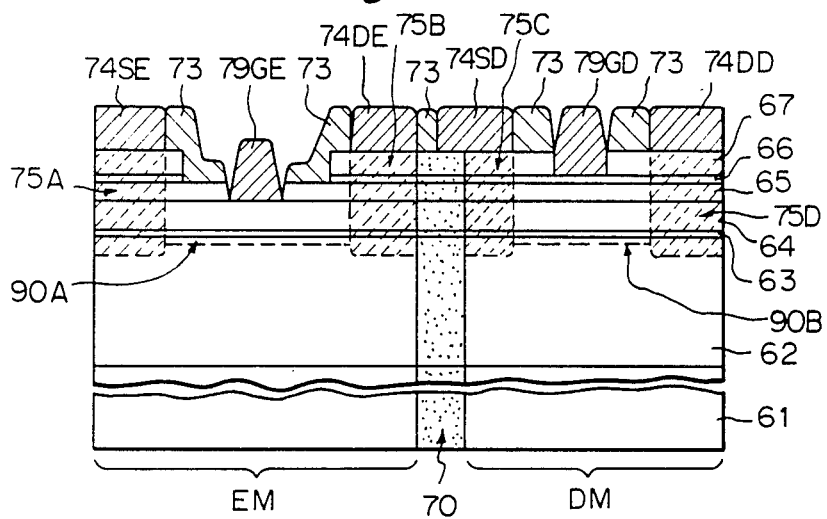

Next, another electrode metal film for gates is deposited on the photoresist mask film 76 and exposed portions of the AlGaAs layer 66 and 64 and is selectively removed by a lift-off method, as mentioned in the first embodiment, so that gate electrodes 79GE and 79GD are formed, as illustrated in FIG. 12. Thus, the enhancement-mode FET and the depletion-mode FET are formed in the portions EM and DM, respectively. When the enhancement-mode FET and the depletion-mode FET operate, layers 90A and 90B of two-dimensional electron gas are generated in the upper portion of the undoped GaAs layer 62 adjoining the GaAs/AlGaAs heterojunction plane.

Figure 13:
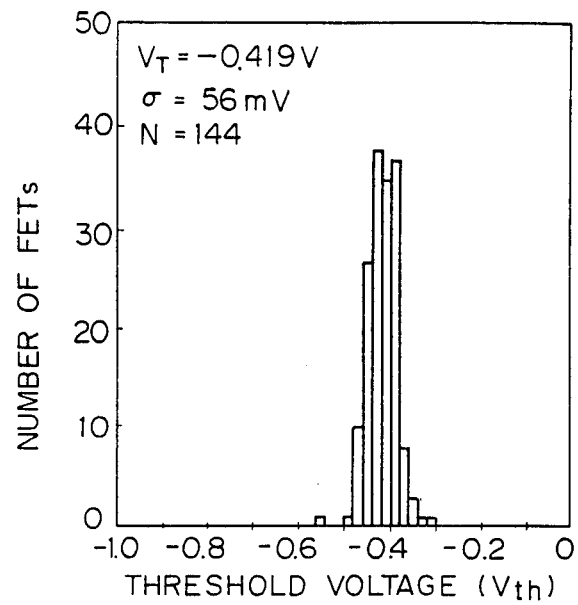
FIG. 13 is a graph of the distribution of the threshold voltages ($V_{th}$) of depletion-mode FETs formed in accordance with a method of the present invention.
Figure 14:
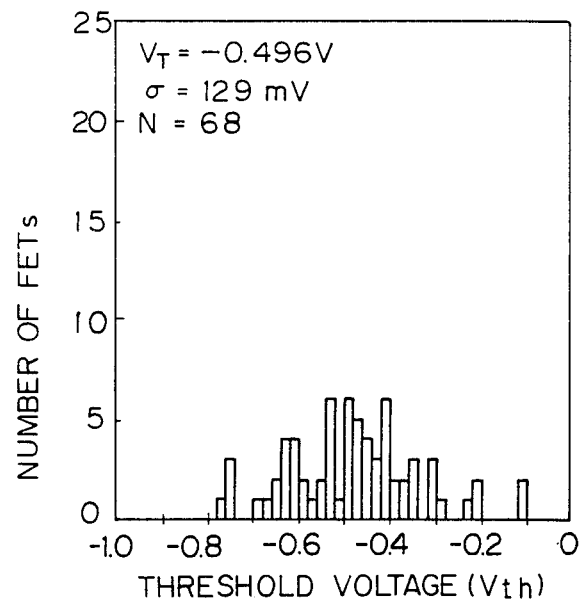
FIG. 14 is a graph of the distribution of the threshold voltages ($V_{th}$) of depletion-mode FETs formed in accordance with a conventional method.

In the case where many enhancement-mode FETs and depletion mode FETs are produced by using the above-mentioned heterojunction semiconductor substrate in accordance with the process of the third embodiment, an average threshold voltage $V_T$ of 0.77 V and a high uniformity of threshold voltage $V_{th}$ of the enhancement-mode FETs are obtained, and an average threshold voltage $V_T$ of $-0.419$ V and uniformity of threshold voltage $V_{th}$ shown in FIG. 13 of the depletion-mode FETs are obtained. The results of FIG. 13 are obtained from 144 depletion mode FETs. The standard deviation $\sigma$ of threshold voltage is 56 mV. As a comparative example, many depletion-mode FETs are formed by using a heterojunction semiconductor substrate without an etching stoppable AlGaAs layer. In this case, the results shown in FIG. 14 are obtained from 68 FETs. An average threshold voltage $V_T$ of approximately $-0.50$ V and a standard deviation $\sigma$ of 129 mV for the threshold voltage of the depletion-mode FETs are obtained, as shown in FIG. 14. As is clear from FIGS. 13 and 14, the uniformity of threshold voltage of the depletion-mode FETs produced in accordance with the present invention is very superior to that of a conventional case.

Figure 15:
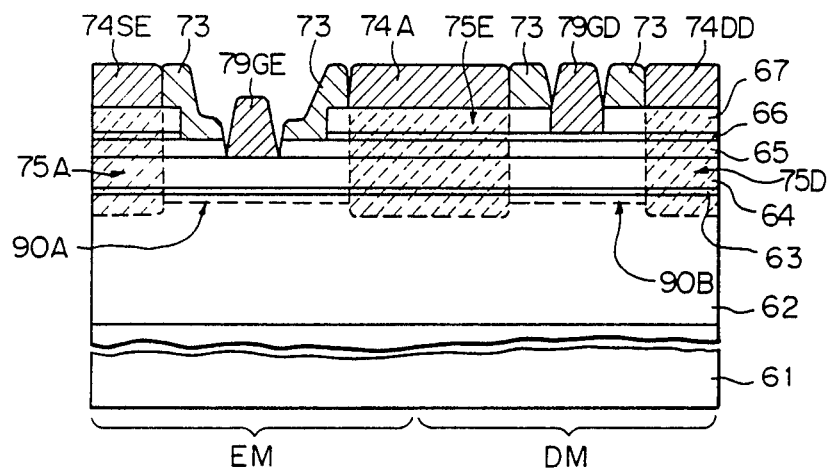
FIG. 15 is a schematic partially sectional view of a GaAs semiconductor device of an E/D construction inverter similar to that of FIG. 12.
Figure 16:
FIG. 16 is an inverter circuit.

FIG. 15 is a schematic partially sectional view of a GaAs semiconductor device of the inverter circuit of FIG. 16 having an E/D construction similar to that of FIG. 12, according to a fourth embodiment of the present invention. Portions in FIG. 15 the same as those in FIGS. 9 to 12 are indicated by the same reference numerals. The GaAs semiconductor device is produced in accordance with the production process mentioned in the third embodiment except that the formation of the isolation region 70 of FIG. 12 is not carried out and a common electrode 74A (FIG. 15) is formed instead of the electrodes 74DE and 74SD (FIG. 12).

Figure 17:
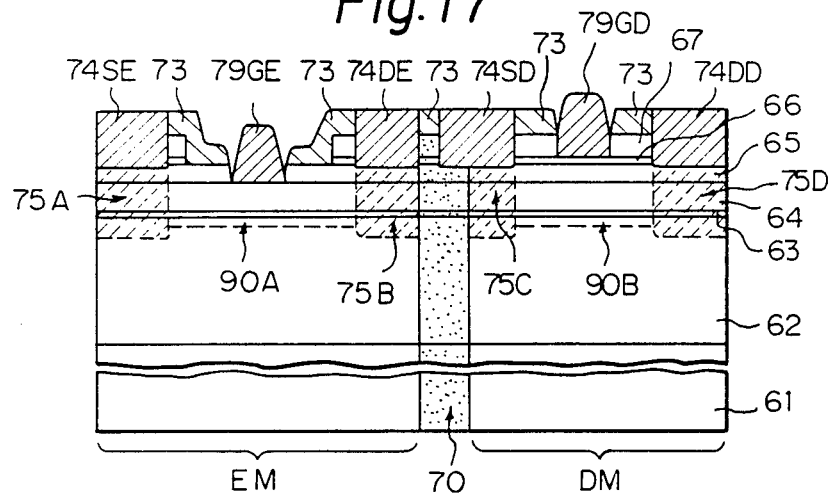
FIG. 17 is a schematic partially sectional view of a GaAs semiconductor device similar to that of FIG. 12.

FIG. 17 is a schematic partially sectional view of a GaAs semiconductor device having an E/D construction and similar to that of FIG. 12, according to a fifth embodiment of the present invention. Portions in FIG. 17 the same as those in FIGS. 9 to 12 are indicated by the same reference numerals. The GaAs semiconductor device is manufactured in accordance with the process mentioned in the third embodiment except for the addition of an etching step prior to the deposition of the electrode metal film for source and drain electrodes. Namely, after the formation of source-electrode contact windows and drain-electrode contact windows in the SiO$_2$ film 73, the exposed contact GaAs layer 67 and the etching stoppable AlGaAs layer 66 are selectively etched by applying, e.g., a wet chemical etching method to form recesses in which portions of the N-type GaAs layer 75 are exposed. Thus, the source electrodes 74SE and 74SD and the drain electrodes 74DE and 74DD can come into contact with the N-type GaAs layer 75 containing no aluminum and, consequently, the contact property of the electrodes is very good.

As mentioned above, according to the present invention, each element (FET) of an E/D construction semiconductor device as well as an E/D inverter having gate metal electrodes formed on the AlGaAs is provided. The compound semiconductor under the gate of the enhancement-mode FET comprises an AlGaAs layer, while that under the gate of the depletion-mode FET comprises an AlGaAs layer, a GaAs layer, and an AlGaAs layer. In the case of the depletion-mode FET, the effects brought by forming a GaAs layer between the AlGaAs layers are a decrease of the contact resistance Rc and an improvement of the mutual conductance gm. In seeing the operation of this type of FET, it is recognized that an electric route leads to an electrode through the AlGaAs layer and an alloyed contact layer from a channel portion directly under the gate beside another electric route leading to the electrode through the channel of the two-dimensional electron gas and the alloyed contact layer. The band gap of AlGaAs, for example, Al$_{0.3}$Ga$_{0.7}$As is $\sim 1.7$ eV, which is larger than that ($\sim 1.4$ eV) of GaAs, while the electric conductivity of AlGaAs is relatively low (e.g., its electron mobility is about 1/10th that of GaAs). The AlGaAs has impurities of a deep level which have a complex influence on electrical properties. Where a portion of the electron-supply AlGaAs layer is replaced with GaAs, the contact parasitic sheet resistance Rs in case of a gate width of 200 μm is 4Ω, which is smaller than that (10Ω) of a conventional case, which contributes to improvement of the mutual conductance gm. The contact resistance Rc is reduced by increasing the thickness of GaAs. Accordingly, DCFL circuit having an E/D construction is formed by using the above-mentioned FETs utilizing a heterojunction, whereby the DCFL circuit has the above mentioned features and a controlled threshold voltage Vth.

It will be obvious that the present invention is not restricted to the above-mentioned embodiments and that many variations are possible for persons skilled in the art without departing from the scope of the invention. For example, the isolation between an enhancement-mode FET and depletion-mode FET may be attained by forming a groove extending into an undoped GaAs layer through the GaAs/AlGaAs heterojunction instead of the insulator regions 10 and 11 (FIG. 6) or the isolation region 70 (FIG. 12).

In the case of the above-mentioned embodiments, the grooves 17 and 18 (77 and 78) for gate electrodes are formed by a dry etching method. It is preferable to form both the grooves 17 and 18 (77 and 78) simultaneously in the dry etching step, as mentioned above. It is possible to carry out etching for the groove 17 and etching for the groove 18, respectively. Furthermore, it is possible to adopt a wet etching method instead of the dry etching, if selectivity and controllability of the wet etching method are good. For this case, the etching liquid should etch GaAs rapidly and AlGaAs slowly. Such an etching liquid includes a sulfuric acid system liquid and an ammonia system liquid. For example, the sulfuric acid system liquid may comprise $H_2SO_4:H_2O_2:H_2O = 95:5:5$, by volume ratio, and the ammonia system liquid may comprise $NH_3:H_2O_2 = 10:1$, by volume ratio. When GaAs and $Al_xGa_{1-x}As$ (x ranging from 0.3 to 0.5) are etched by using the above etching liquid, the etch rate of GaAs is about 10 times that AlGaAs by controlling the $H_2O_2$ amount and etching temperature.

Although the heterojunction is formed by a combination of GaAs and AlGaAs in the above-mentioned embodiments, it is possible to use combinations of AlGaAs-Ge, GaAs-Ge, CdTe-InSb, GaSb-InAs, or the like for the heterojunction. According to the present invention, in a compound semiconductor layer having a large band gap, another semiconductor layer of which the etch rate is much slower than that of the compound semiconductor is formed. For the present time, however, a heterojunction of GaAs and AlGaAs is most preferable.

I claim:

1. A method of manufacturing a GaAs semiconductor device comprising an enhancement-mode GaAs FET having a heterojunction and utilizing a two-dimensional electron gas and a depletion-mode GaAs FET, comprising the steps of:
   forming an undoped GaAs layer on a semi-insulating GaAs substrate;
   forming an N-type AlGaAs layer on said undoped GaAs layer;
   forming a first GaAs layer on said N-type AlGaAs layer;
   forming an AlGaAs layer serving as an etching stoppable layer on said first GaAs layer;
   forming a second GaAs layer on said etching stoppable AlGaAs layer;
   selectively etching said second GaAs layer, said etching stoppable AlGaAs layer, and said first GaAs layer at a position for a gate of the enhancement GaAs FET; and
   a further etching step of selectively etching the GaAs of said first GaAs layer remaining at the position for the gate of the enhancement-mode GaAs FET and of said second GaAs layer at a position for a gate of the depletion-mode GaAs FET, the etching being stopped at said N-type AlGaAs layer and said etching stoppable AlGaAs layer, respectively.

2. A method according to claim 1, wherein said undoped GaAs layer, said N-type AlGaAs layer, said first GaAs layer, said etching stoppable AlGaAs layer, and said second GaAs layer are formed by a molecular beam epitaxy method.

3. A method according to claim 1, wherein said undoped GaAs layer, said N-type AlGaAs layer, said first GaAs layer, said etching stoppable AlGaAs layer, and said second GaAs layer are formed by a metal organic chemical vapor deposition method.

4. A method according to claim 1, wherein said N-type AlGaAs layer has a thickness in the range from 25 to 60 nm.

5. A method according to claim 1, wherein said etching stoppable AlGaAs layer has a thickness in the range from 1 to 10 nm.

6. A method according to claim 5, wherein said etching stoppable AlGaAs layer has a thickness in the range from 3 to 6 nm.

7. A method according to claim 1, wherein said further step of selectively etching said GaAs is carried out by a dry etching method.

8. A method according to claim 7, wherein said dry etching method is a reactive ion etching method using an etchant gas comprising at least one of a chlorine system gas and a fluorine system gas.

9. A method according to claim 8, wherein said etchant gas comprises $CCl_2F_2$.

10. The method of claim 7, wherein said dry etching method is a reactive ion etching method using an etchant gas comprising chlorine.

11. A method according to claim 7, wherein said dry etching method is a reactive ion etching method using an etchant gas comprising fluorine.

12. A method according to claim 1 comprising the step of forming an undoped AlGaAs layer on said undoped GaAs layer, prior to said step of forming said N-type AlGaAs layer.

13. A method according to claim 1, comprising the step of forming source and drain electrodes for said enhancement-mode and depletion-mode GaAs FETs on said second GaAs layer, prior to said further step of selectively etching the GaAs.

14. A method according to claim 1, further comprising the step of forming gate electrodes for said enhancement-mode and depletion-mode GaAs FETs on said N-type AlGaAs layer and said AlGaAs etching stoppable layer, respectively.

15. The method of claim 1, comprising forming a buffer layer of undoped AlGaAs on said undoped GaAs layer and forming said N-type AlGaAs layer on said buffer layer.

16. The method of claim 1, comprising forming source and drain electrodes for said GaAs FETs in contact with said first GaAs layer.

17. The method of claim 1, further comprising the step of forming an undoped AlGaAs layer on said undoped GaAs layer, prior to said step of forming said electron-supply AlGaAs layer.

18. The method of claim 1, comprising forming a plurality of devices each having said enhancement-mode FET and said depletion-mode FET so that the absolute value of the ratio of the standard deviation of the threshold voltage of said depletion-mode FETs to the average threshold voltage is at least 0.056 V/0.50 V = 0.13 for 144 of said devices.

19. A method of manufacturing a GaAs semiconductor device comprising an enhancement-mode GaAs FET having a heterojunction and utilizing a two-dimensional electron gas and a depletion-mode GaAs MESFET, comprising the steps of:

forming an undoped GaAs layer on a semi-insulating GaAs substrate;

forming an N-type AlGaAs layer as an electron-supply layer on said undoped GaAs layer;

forming an N-type GaAs layer as an active layer of the depletion-mode GaAs MESFET on said N-type AlGaAs layer;

forming an AlGaAs layer serving as an etching stoppable layer on said active GaAs layer;

forming a GaAs layer as a contact layer on said etching stoppable AlGaAs layer;

forming an isolation region for the depletion-mode GaAs MESFET;

selectively etching said contact GaAs layer, said etching stoppable AlGaAs layer, and the active GaAs layer at a position for a gate of the enhancement mode GaAs FET to make the thickness of the remaining active GaAs layer similar to that of said contact layer;

forming source and drain electrodes of both the GaAs FETs on said contact GaAs layer;

a further etching step of selectively etching the GaAs of said active GaAs layer remaining at the position for the gate of the enhancement-mode GaAs FET and of said contact GaAs layer at a position for a gate of the depletion-mode GaAs MESFET, the etching being stopped at said electron-supply AlGaAs layer and said etching stoppable AlGaAs layer, respectively; and forming respective gate electrodes for said enhancement-mode and depletion-mode GaAs FETs on said electron-supply AlGaAs layer and on said etching stoppable AlGaAs layer, respectively.

20. A method according to claim 19, wherein said undoped GaAs layer, said electron-supply AlGaAs layer, said active GaAs layer, said etching stoppable AlGaAs layer, and said contact GaAs layer are formed by a molecular beam epitaxy method.

21. A method according to claim 19, wherein said undoped GaAs layer, said electron-supply AlGaAs layer, said active GaAs layer, said etching stoppable AlGaAs, and said contact GaAs layer are formed by a metal organic chemical vapor deposition method.

22. A method according to claim 19, wherein said electron-supply GaAs layer has a thickness of from 25 to 60 nm.

23. A method according to claim 19, wherein said etching stoppable AlGaAs layer has a thickness of from 1 to 10 nm.

24. A method according to claim 23, wherein said etching stoppable AlGaAs layer has a thickness of from 3 to 6 nm.

25. A method according to claim 19, wherein said further step of selectively etching the GaAs is carried out by a dry etching method.

26. A method according to claim 25, wherein said dry etching method is a reactive ion etching method using an etchant comprising a chlorine system gas and a fluorine system gas.

27. A method according to claim 26, wherein said etchant gas comprises $CCl_2F_2$.

28. A method according to claim 26, wherein said dry etching method is a reactive ion etching method using an etchant gas comprising fluorine.

29. The method of claim 25, wherein said dry etching method is a reactive ion etching method using an etchant gas comprising chlorine.

30. A method according to claim 19, further comprising the step of forming an undoped AlGaAs layer on said undoped GaAs layer, prior to said step of forming said electron-supply AlGaAs layer.

31. The method of claim 19, comprising etching respective portions of said GaAs contact layer and said AlGaAs etching stoppable layer and forming source and drain electrodes for said GaAs FETs on said N-type GaAs active layer.

32. A method of manufacturing a GaAs semiconductor device comprising an enhancement-mode GaAs FET and a depletion-mode GaAs FET which have a heterojunction and utilize a two-dimensional electron gas, comprising the steps of:

forming an undoped GaAs layer on a semi-insulating GaAs substrate;

forming an N-type AlGaAs layer as an electron-supply layer on said undoped GaAs layer;

forming a first GaAs layer on said electron-supply AlGaAs layer;

forming an AlGaAs layer serving as an etching stoppable layer on said first GaAs layer;

forming a second GaAs layer on said etching stoppable AlGaAs layer;

selectively etching said second GaAs layer, said etching stoppable AlGaAs layer, and said first GaAs layer at a position for a gate of the enhancement-mode GaAs FET;

forming source and drain electrodes of both the FETs on said second GaAs layer;

a further etching step of selectively etching the GaAs of said first GaAs layer remaining at the position for the gate of enhancement-mode GaAs FET and of said second GaAs layer at a position for a gate of the depletion-mode GaAs FET, the etching being stopped at said electron-supply AlGaAs layer and said etching stoppable AlGaAs layer, respectively; and forming respective gate electrodes for said enhancement-mode and depletion-mode GaAs FETs on said electron-supply AlGaAs layer and on said etching stoppable AlGaAs layer, respectively.

33. A method according to claim 32, wherein said undoped GaAs layer, said electron-supply AlGaAs layer, said first GaAs layer, said etching stoppable AlGaAs layer, and said second GaAs layer are formed by a molecular beam epitaxy method.

34. A method according to claim 32, wherein said undoped GaAs layer, said electron-supply AlGaAs layer, said first GaAs layer, said etching stoppable AlGaAs, and said second GaAs layer are formed by a metal organic chemical vapor deposition method.

35. A method according to claim 32, wherein said first GaAs layer has a thickness of from 25 to 200 nm.

36. A method according to claim 32, wherein said electron-supply AlGaAs layer has a thickness of from 25 to 60 nm.

37. A method according to claim 32, wherein said etching stoppable AlGaAS layer has a thickness of from 1 to 10 nm.

38. A method according to claim 37, wherein said etching stoppable AlGaAs layer has a thickness of from 3 to 6 nm.

39. A method according to claim 32, wherein said further step of selectively etching the GaAs is carried out by a dry etching method.

40. A method according to claim 39, wherein said dry etching method is a reactive ion etching method using an etchant comprising a chlorine system gas and a fluorine system gas.

41. A method according to claim 39, wherein said dry etching method is a reactive ion etching method using an etchant gas comprising chlorine and fluorine.

42. The method of claim 39, wherein said dry etching method is a reactive ion etching method using an etchant gas comprising chlorine.

43. The method of claim 39, wherein said dry etching method is a reactive ion etching method using an etchant gas comprising fluorine.

44. A method according to claim 32, wherein said etchant gas comprises $CCl_2F_2$.

45. A method according to claim 32, further comprising the step of forming an undoped AlGaAs layer on said undoped GaAs layer, prior to said step of forming said electron-supply AlGaAs layer.

46. The method of claim 32, comprising etching respective portions of said second GaAs layer and said AlGaAs etching stoppable layer and forming source and drain electrodes for said GaAs FETs in contact with said first GaAs layer.

* * * * *

UNITED STATES PATENT AND TRADEMARK OFFICE
CERTIFICATE OF CORRECTION

PATENT NO. : 4,635,343

DATED : January 13, 1987

INVENTOR(S) : Kuroda

It is certified that error appears in the above-identified patent and that said Letters Patent is hereby corrected as shown below:

```
Column 1, line 25, "patent" should be --Patent--;
          line 26, "application" should be --Application--.
Column 2, line 36, "Aother" should be --Another--.
Column 9, line 26, "liquid" should be --liquids--.
```

Signed and Sealed this

Twenty-sixth Day of January, 1988

Attest:

DONALD J. QUIGG

Attesting Officer

Commissioner of Patents and Trademarks